United States Patent
Sikkink et al.

(10) Patent No.: US 6,518,812 B1
(45) Date of Patent: Feb. 11, 2003

(54) DISCRETE DELAY LINE SYSTEM AND METHOD

(75) Inventors: Mark Ronald Sikkink; Nan Ma, both of Chippewa Falls, WI (US)

(73) Assignee: Silicon Graphics, Inc., Mountain View, CA (US)

(*) Notice: Subject to any disclaimer, the term of this patent is extended or adjusted under 35 U.S.C. 154(b) by 0 days.

(21) Appl. No.: 09/619,959

(22) Filed: Jul. 20, 2000

(51) Int. Cl.⁷ .............................................. H03H 11/26
(52) U.S. Cl. ....................................... 327/284; 327/277
(58) Field of Search .............................. 327/261, 262, 327/269–271, 276, 277, 284, 392, 393, 395, 400, 403

(56) References Cited

U.S. PATENT DOCUMENTS

| | | | |
|---|---|---|---|
| 4,514,749 A | 4/1985 | Shoji | 357/68 |
| 4,637,018 A | 1/1987 | Flora et al. | 371/1 |
| 4,696,019 A | 9/1987 | Tulpule et al. | 375/107 |
| 4,755,704 A | 7/1988 | Flora et al. | 307/269 |
| 4,805,195 A | 2/1989 | Keegan | 375/106 |
| 4,833,695 A | 5/1989 | Greub | 375/118 |
| 4,845,390 A | 7/1989 | Chan | 307/602 |
| 4,860,322 A | 8/1989 | Lloyd | 375/107 |
| 4,926,066 A | 5/1990 | Maini et al. | 307/303.1 |
| 4,959,540 A | 9/1990 | Fan et al. | 250/227.12 |
| 5,087,829 A | 2/1992 | Ishibashi et al. | 307/269 |
| 5,329,188 A | 7/1994 | Sikkink et al. | 307/517 |
| 5,550,514 A | * 8/1996 | Liedberg | 331/1 A |
| 5,727,021 A | * 3/1998 | Truebenbach | 375/226 |
| 6,060,939 A | * 5/2000 | Woeste | 327/403 |
| 6,215,816 B1 | * 4/2001 | Gillespie et al. | 370/402 |

* cited by examiner

Primary Examiner—Kenneth B. Wells
Assistant Examiner—Cassandra Cox
(74) Attorney, Agent, or Firm—Schwegman, Lundberg, Woessner & Kluth, P.A.

(57) ABSTRACT

A composite delay line includes a first and a second delay line connected to a multiplexer. The multiplexer has a first and a second input. The first delay line includes an input, an output and first control means for controlling delay. The second delay line includes an input, an output and second control means for controlling delay. The output of each delay line is connected to the input of the multiplexer. Control logic connected to the first control means selects a delay through the first delay line. Control logic connected to the second control means selects a delay through the second delay line. Control logic connected to the multiplexer selects between the output of the first delay line and the second delay line.

8 Claims, 6 Drawing Sheets

DISCRETE DELAY LINE SYSTEM AND METHOD

FIELD OF THE INVENTION

The present invention is related to delay line technology, and more particularly to a discrete delay line architecture with wide delay range, fine granularity and small minimum delay.

BACKGROUND INFORMATION

Delay lines serve a variety of functions within digital systems. They can be used, for instance, to deskew a clock or to change the phase of a clock or of a signal.

To date, a variety of approaches have been used to add delay to a signal. Delay has been implemented using delay lines external to the integrated circuit. Such an approach, however, consumes pins and real estate both on the integrated circuit and on the circuit board.

Conventional Delay Locked Loops (DLLs) have also been used. DLLs, however, limit flexibility. That is, only a limited number of delay choices can be provided, and the choices must be determined at design time.

Discrete delay lines have also been implemented directly on the integrated circuit. Under such an approach, standard cell or other ASIC technology is used to implement the delay line. The integrated circuit approach to discrete delay lines is advantageous in that regular ASIC design and verification tools can be used to design and test the delay line. Delay lines designed using this approach, however, can exhibit variation in delay as the operating environment (e.g., temperature, voltage level, etc.) changes. In addition, since the delay line is implemented directly on an integrated circuit, it can exhibit changes in delay due to variations in the integrated circuit manufacturing process.

To date, discrete delay lines have taken the form of either linear discrete delay line architectures or binary weighted delay lines. Linear weighted delay lines offer small minimum delay, relatively coarse granularity, and have an inefficient area function. The granularity can be improved, but at the expense of increasing minimum delay.

On the other hand, binary weighted delay lines have large delay range, efficient area functions, excellent linearity, fine granularity, and relatively large minimum delay. Binary weighted delay lines can, however, cause large temporary glitches in the signal or clock being delayed when the binary control code switches at carry boundaries. What is needed is a delay line architecture having a wide delay range, a small minimum delay and fine granularity. In addition, what is needed is a delay line which has large maximum delays and fine granularity but which operates glitch-free when the delay line is switched to a different delay parameter.

SUMMARY OF THE INVENTION

According to one aspect of the present invention, a composite delay line includes a first and a second delay line connected to a multiplexer. The multiplexer has a first and a second input. The first delay line includes an input, an output and first control means for controlling delay. The second delay line includes an input, an output and second control means for controlling delay. The output of each delay line is connected to the input of the multiplexer. Control logic connected to the first control means selects a delay through the first delay line. Control logic connected to the second control means selects a delay through the second delay line. Control logic connected to the multiplexer selects between the output of the first delay line and the second delay line.

According to another aspect of the present invention, a delay line includes a multiplexer having a first and a second input, a binary weighted delay line connected to the first input and a linear discrete delay line connected to the second input. The binary weighted delay line includes an input and binary control means for controlling delay. The linear discrete delay line includes an input and linear control means for controlling delay. Control logic connected to the binary control means selects a delay through the binary weighted delay line. Control logic connected to the linear control means selects a delay through the linear discrete delay line. Control logic connected to the multiplexer selects between the output of the binary weighted delay line and the linear discrete delay line.

According to yet another aspect of the present invention, a system and method of delaying a signal is described. The delay system includes a first and a second delay line. A signal is received and a first delayed signal is formed by passing the signal through the first delay line. A second delayed is signal also formed by passing the signal through the second delay line. One of the first and second delayed signals is selected and driven as the selected delayed signal.

According to yet another aspect of the present invention, a system and method is described for suppressing glitches in the output signal of a binary weighted delay system having first and second binary weighted delay lines. A first delayed signal is formed by passing the signal through the first binary weighted delay line. A second delayed signal is formed by passing the signal through the second binary weighted delay line. The first delayed signal is driven as the output signal. When the system determines that a change in delay is needed, delay is changed first in the second binary weighted delay line. The system waits for a predetermined period of time and then drives the second delayed signal as the output signal.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Some portions of the detailed descriptions which follow are presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a selfconsistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussions, terms such as "processing" or "computing" or "calculating" or "determining" or "displaying" or the like, refer to the action and processes of a computer system, or similar computing device, that manipulates and transforms data represented as physical (e.g., electronic) quantities within the computer system's registers and memories into other data similarly represented as physical quantities within the computer system memories or registers or other such information storage, transmission or display devices.

Figure 1:
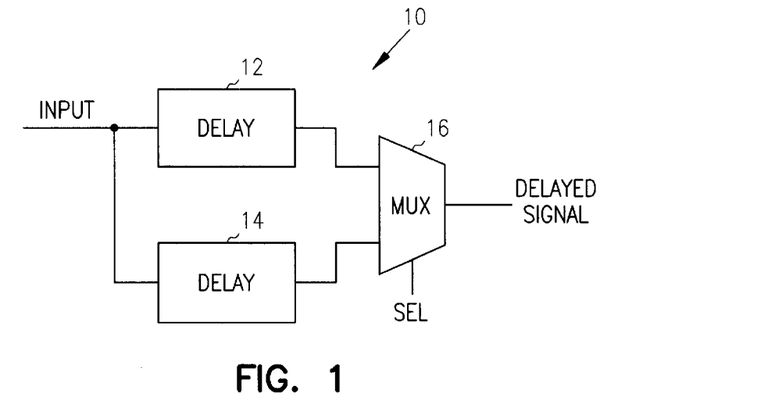
FIG. 1 illustrates a composite delay line according to the present invention.

A discrete delay line 10 is shown generally in FIG. 1. Discrete delay line 10 includes a first delay line 12, a second delay line 14 and a multiplexer 16. In operation, an input signal is routed through the first and second delay lines (12, 14) and selectively driven by multiplexer 16.

In one embodiment, the delays possible through delay line 12 are different from those available to a signal passing through delay line 14. In one such embodiment, delay lines 12 and 14 are designed such that together they cover a wide range of delays with fine granularity. In another such embodiment, delay lines 12 and 14 are designed such that together they cover two or more discrete ranges of delays with fine granularity.

In one embodiment, delay lines 12 and 14 are two different types of delay lines. For instance, in one embodiment, delay line 12 is a binary weighted delay line while delay line 14 is a linear discrete delay line. As noted above, linear discrete delay lines have very small minimum delay while binary weighted discrete delay lines simultaneously offer large maximum delays and fine granularity, with efficient area utilization. Combining the two into an environment where the crossover (linear to binary and reverse) is seamless, offers the advantages of both. It should be noted, however, that other types of discrete delay lines, or even variations of the same type of discrete delay line, can be used.

As noted above, binary weighted delay lines can cause large temporary delay glitches when the binary control code switches at carry boundaries. In one embodiment, a control algorithm remedies this problem and allows the system to change the delay control code at any time, without creating glitches. The control algorithm will be discussed in further detail below.

In one embodiment, multiplexer 16 is designed to have balanced delay from either input. In another embodiment, multiplexer 16 is designed to have different delays through each of its inputs. In such a case, the delay added by multiplexer 16 must be taken into account in designing delay lines 12 and 14.

In one embodiment, delay elements in delay line 12 and 14 are realized through standard cell inverter/multiplexer combinations. In another embodiment, delay lines 12 and 14 are implemented through full-custom differential logic, or through some other form of integrated circuit implementation. Similar approaches can be used to implement multiplexer 16.

Figure 2:
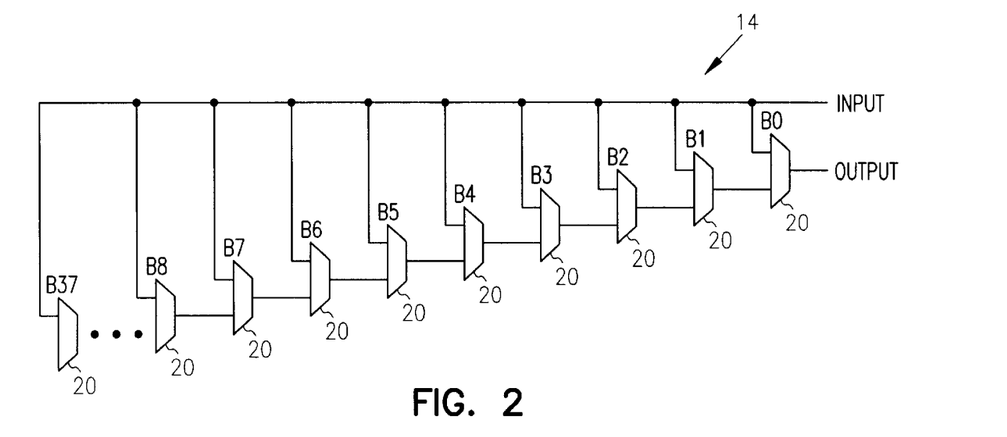
FIG. 2 illustrates a linear discrete delay line which can be used in the composite delay line of FIG. 1.

In one embodiment, delay line 14 is a linear discrete delay line. One such delay line is shown in FIG. 2. Delay line 14 in FIG. 2 includes two or more 2:1 multiplexers 20 connected in series. The 2:1 multiplexers 20 are designed to have balanced delay from either input. Multiplexers 20 are cascaded to form a chain with a delay granularity of one multiplexer 20 delay. In one such embodiment, each of the multiplexers 20 is designed to have a delay of two units of time.

Figure 3:
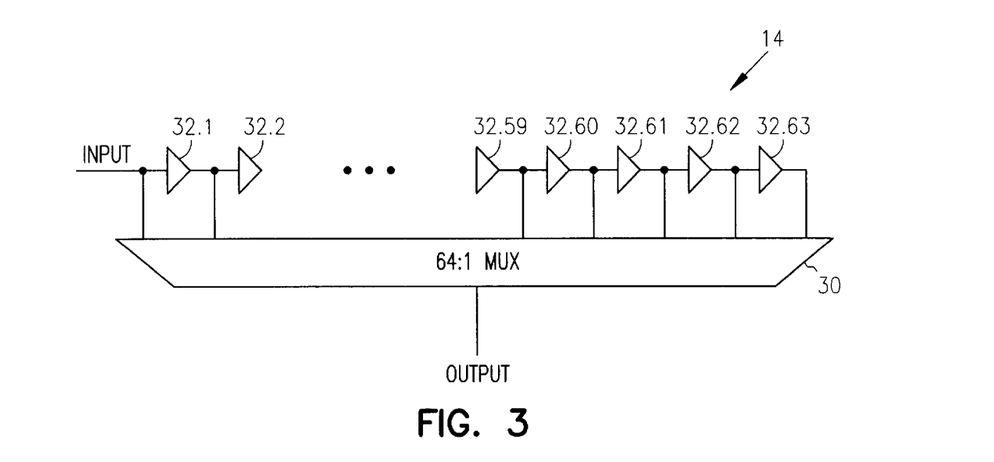
FIG. 3 illustrates an alternate embodiment of a linear discrete delay line which can be used in the composite delay line of FIG. 1.

An alternate linear discrete delay line embodiment of delay line 14 is shown in FIG. 3. Delay line 14 in FIG. 3 includes a single multiplexer 30 connected to a chain of delay elements 32. In the embodiment shown sixty-three delay elements 32 are connected in a chain. The input of each delay element 32 is connected to one of the inputs of multiplexer 30. In addition, the output of the last delay element 32.63 is connected to an input of multiplexer 30. In one embodiment, multiplexer 30 is designed to have balanced delay from each input. In one such embodiment, multiplexer 30 is formed of six stages of 2:1 multiplexers 20 of FIG. 2. In one such embodiment, each of the multiplexers 20 is designed to have a delay of two times the delay of elements 32.

Figure 4:
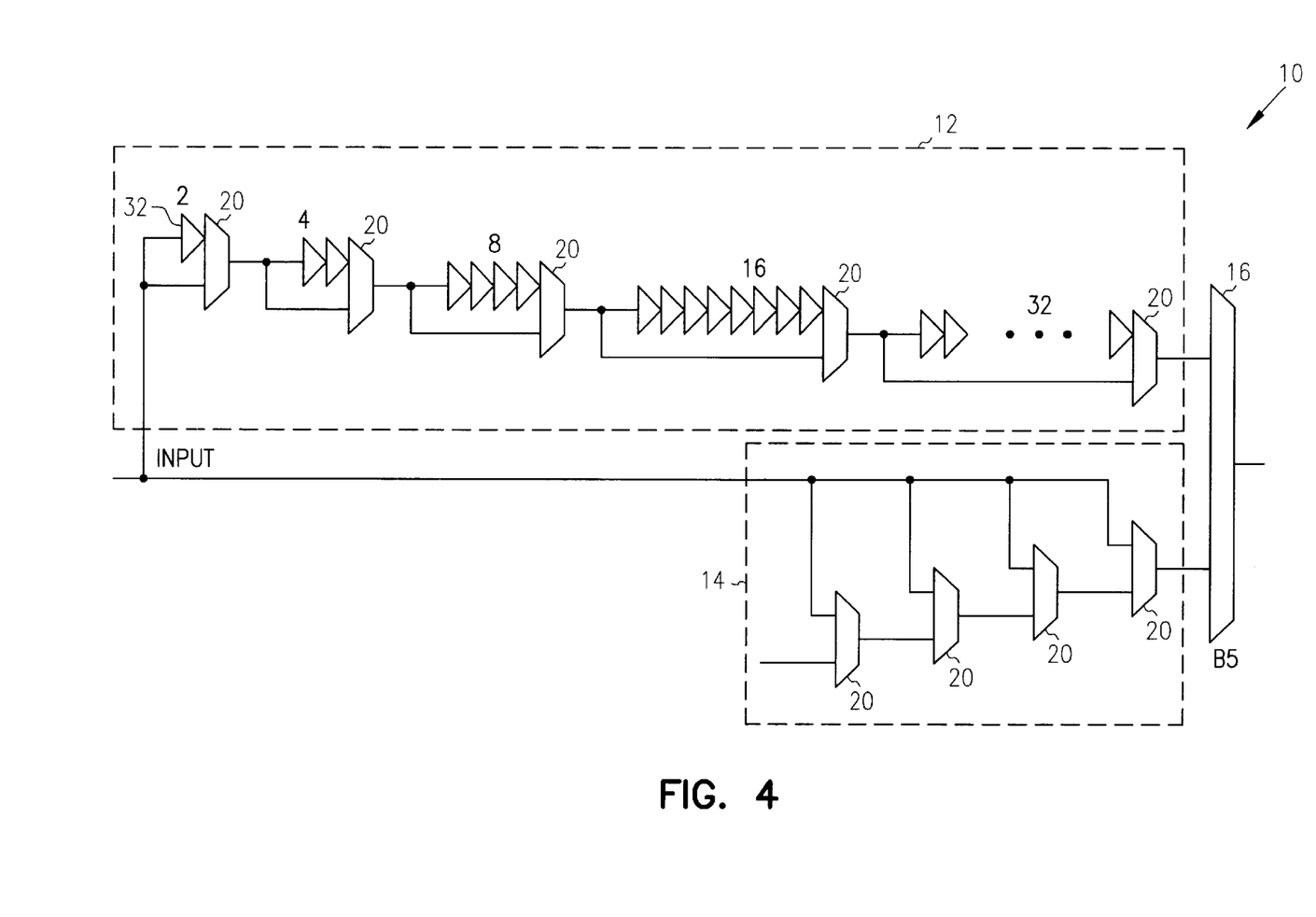
FIG. 4 illustrates one embodiment of the composite delay line of FIG. 1.

An example of a composite delay line 10 is shown in FIG. 4. Composite delay line 10 includes a delay line 12 implemented as a binary weighted delay line and a delay line 14 implemented as a linear discrete delay line. In the embodiment shown, each stage of the binary delay line is a balanced 2:1 multiplexer 20, whose inputs are logically equivalent, but one is delayed. The delay in each stage of delay line 12 is weighted to give the delay line its binary properties.

In one embodiment, delay of the first stage of delay line 12 is equal to the delay line granularity. The second stage delay is equal to twice the granularity. The third stage delay is equal to four times the granularity, and so on.

In another embodiment, delay elements 32 introduce half the delay of multiplexers 20. In such an embodiment, the delay of the first stage of delay line 12 is two or three times the delay of delay element 32, depending on the delay selected.

In one embodiment, delay line 12 is a binary weighted delay line weighted to have the same granularity as delay line 14. This is done to preserve the overall linearity of the composite delay line.

In the embodiment shown in FIG. 4, delay lines 12 and 14 have a common input and their outputs recombine through multiplexer 16. This adds a multiplexer delay to the minimum delay through each of delay lines 12 and 14. This extra delay must be taken into account when deciding on the proper amount of delay.

In one embodiment, the number of linear multiplexer stages is limited to one less than the number of binary stages. In such an approach, a range transition (i.e., a switch from linear to binary, or reverse) is equivalent to one additional multiplexer delay, providing seamless, linear operation.

Figure 5:
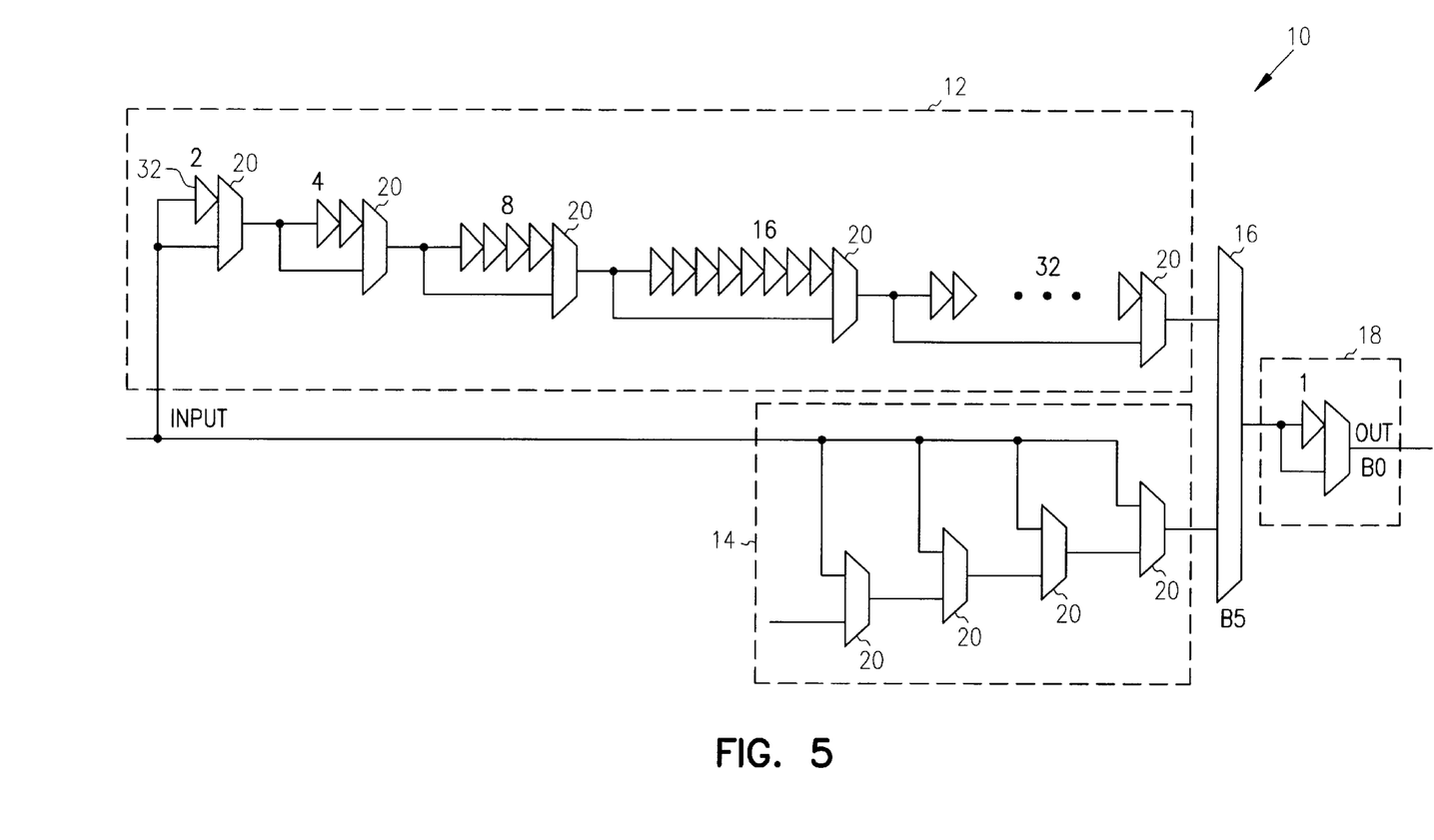
FIG. 5 illustrates another embodiment of the composite delay line of FIG. 1.

Another example of a composite delay line 10 is shown in FIG. 5. Composite delay line 10 includes a delay line 12 implemented as a binary weighted delay line and a delay line 14 implemented as a linear discrete delay line. FIG. 5 adds an additional LSB stage 18 to the delay line of FIG. 4. Such an approach provides finer granularity and makes the entire delay region linear, but increases the minimum delay. As in FIG. 4 above, in one embodiment each stage of the binary delay line is a balanced 2:1 multiplexer 20, whose inputs are logically equivalent, but one is delayed. The delay in each stage of delay line 12 is weighted to give the delay line its binary properties.

Figure 6:
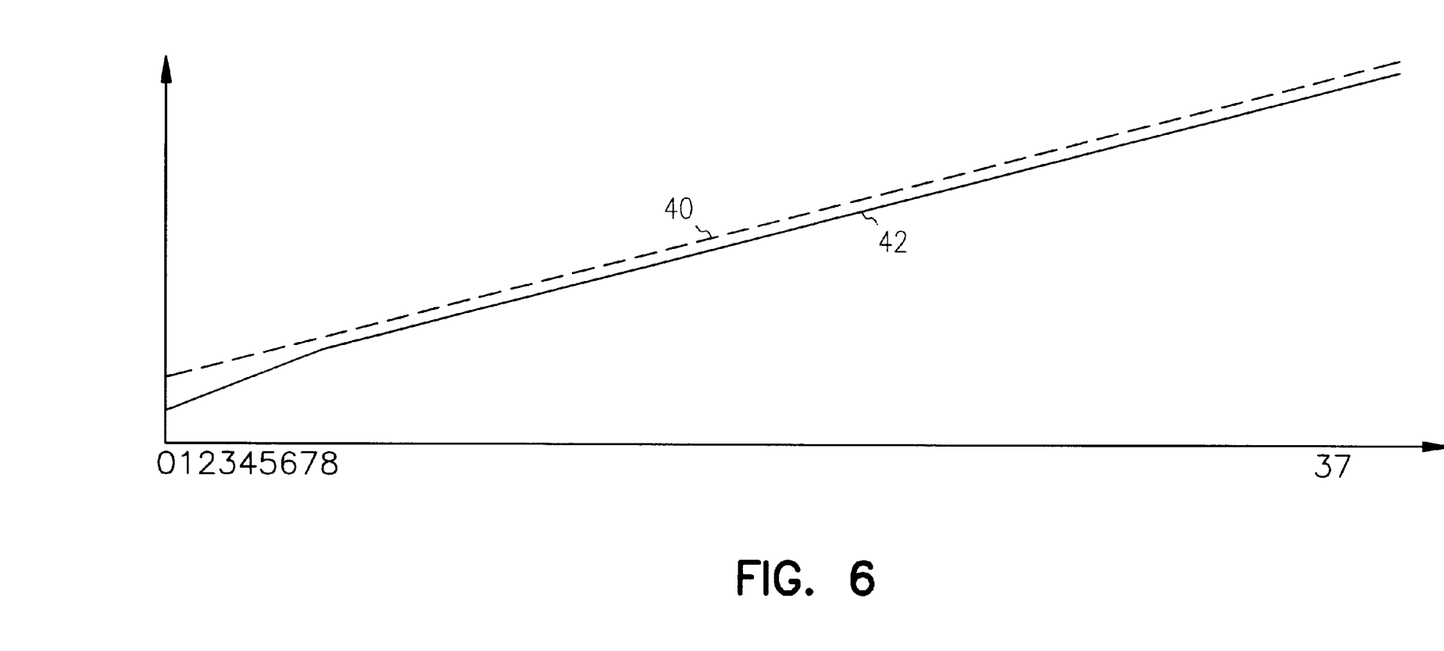
FIG. 6 is a comparison of the composite delay line of FIG. 4 with that of FIG. 5.

A comparison of the composite delay line 10 of FIG. 4 with that of FIG. 5 is shown in FIG. 6, where dashed line 40 illustrates delay of the delay line 10 of FIG. 5 across the range of delay values and where solid line 42 illustrates delay of the delay line 10 (the delay line without the LSB stage) of FIG. 4 across the range of delay values.

One problem in using binary weighted delay lines is that a small increment or decrement in delay can cause a glitch on the output of the delay line as the delay line passes through one or more intermediate states. This may be no problem when delay line 10 is delaying data but it can become a major problem when delaying a clock or a strobe signal.

Figure 7:
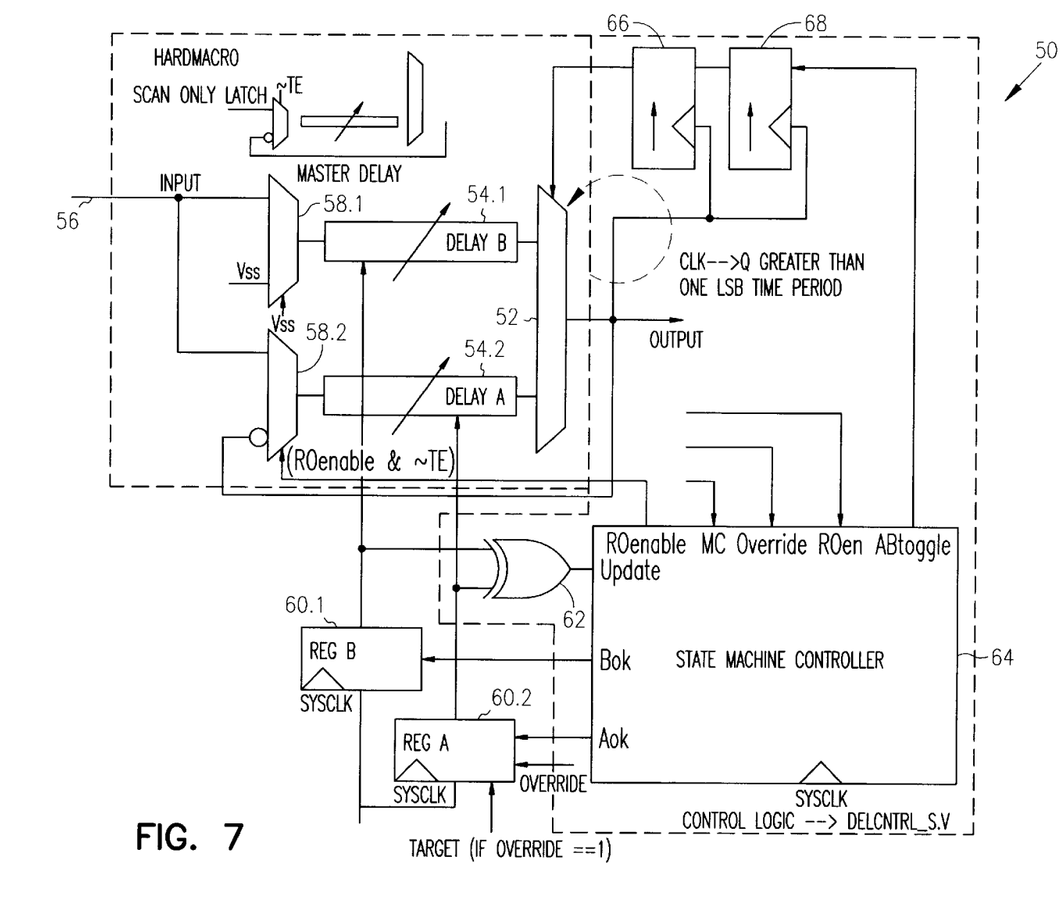
FIG. 7 is a delay line system which suppresses glitches that might occur during a transition of one of the delay lines.

FIG. 7 illustrates a circuit 50 for preventing glitches in a binary weighted delay line, or in any delay line that introduces a glitch on transitions in the delay. Circuit 50 includes a 2:1 multiplexer 52. A delay line 54 is connected to each input of multiplexer 52. The output of multiplexer 52 is a glitch-free signal representative of the input 56 to circuit 50.

In the embodiment shown, delay line 54.1 is a copy of delay line 54.2. In the embodiment shown, input 56 is connected through 2:1 multiplexer 58.1 to delay line 54.1 and through 2:1 multiplexer 58.2 to delay line 54.2. A second input of multiplexer 58.2 is connected to the output of multiplexer 52.

In the embodiment shown in FIG. 7, a control code used to control delay through delay line 54.1 is stored in delay control code register 60.1, while a control code used to control delay through delay line 54.2 is stored in delay control code register 60.2. The two stored control code registers 60 are clocked with the system clock; the output of each register 60 is compared using exclusive-OR 62 to determine when the code changes within one of the registers.

In operation, input 56 is routed through delay 54.1 and 54.2. If circuit 50 is currently set to select the signal passing through delay line 542, for ice, and it is determined that the delay must change, the control code to delay line 54.1 is changed fist and the output of delay line 54.1 is allowed to settle before multiplexer 52 switches to the signal coming out of delay line 54.1. Then the control code to 54.2 is changed.

Figure 8:
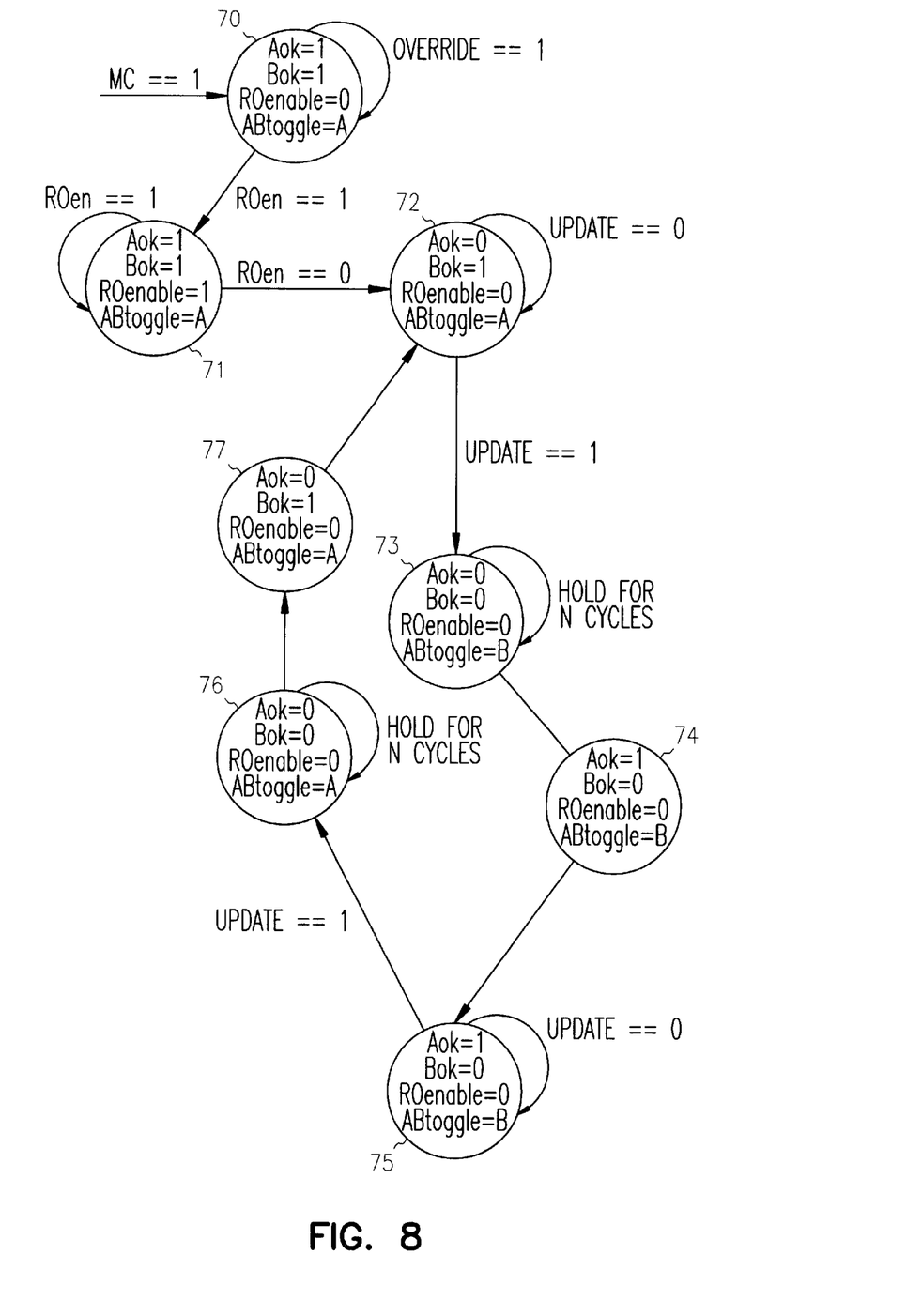
FIG. 8 illustrates a state sequence which can be used with the state machine controller of FIG. 7.

A state sequence which can be used with controller 64 in FIG. 7 is shown in FIG. 8. The sequence starts at 70, the initialization state. State controller 64 returns to this state when mc is set active (e.g., set to a logic level representative of an active state). State controller 64 remains in this state as long as either mc or override remain active. When neither mc nor override are active and signal ROen is active, control moves to 71 and remains there as long as signal ROen remains active. When signal ROen goes inactive, control moves to 72 and remains there until a difference is detected between the contents of register 60.1 and register 60.2. Control then moves to 73 where delay line 54.1 is selected. Control remains at 73 for a predefined number of cycles and then moves through 74 to 75.

Control remains at 75 until once again a difference is detected between the contents of register 60.1 and register 60.2. Control then moves to 76 where delay line 54.2 is selected. Control remains at 76 for a predefined number of cycles and then moves through 77 to 72.

It should be noted that states 72 and 75 are the steady states for selection of delay lines 54.2 and 54.1, respectively.

In the above discussion and in the attached appendices, the term "computer" is defined to include any digital or analog data processing unit. Examples include any personal computer, workstation, set top box, mainframe, server, supercomputer, laptop or personal digital assistant capable of embodying the inventions described herein.

Examples of articles comprising computer readable media are floppy disks, hard drives, CD-ROM or DVD media or any other read-write or read-only memory device.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A composite delay line, comprising:

a multiplexer having a first and a second input;

a first delay line having an input, an output and first control means for controlling delay, wherein the output is connected to the first input of the multiplexer and wherein the first delay line is a binary weighted delay line;

a second delay line having an input, an output and second control means for controlling delay, wherein the output is connected to the second input of the multiplexer, and the second delay line is a linear discrete delay line;

control logic connected to the first control means for selecting a delay through the first delay line;

control logic connected to the second control means for selecting a delay through the second delay line, wherein the delays available through the first delay line are different than the delays available through the second delay line; and control logic connected to the multiplexer for selecting between the output of the first delay line and the output of the second delay line.

2. A delay line, comprising:

a multiplexer having a first and a second input;

a binary weighted delay line having an input, an output and binary control means for controlling delay, wherein the output is connected to the first input of the multiplexer; and a linear discrete delay line having an input, an output and linear control means for controlling delay, wherein the output is connected to the second input of the multiplexer;

control logic connected to the binary control means for selecting a delay through the binary weighted delay line;

control logic connected to the linear control means for selecting a delay through the linear discrete delay line, wherein the delays available through the binary weighted delay line are different than the delays available through the linear discrete delay line; and control logic connected to the multiplexer for selecting between the output of the binary weighted delay line and the output of the linear discrete delay line.

3. The composite delay line of claim 2, wherein the binary weighted delay line and the linear discrete delay line are designed to cover a non-overlapping range of delay.

4. In a system having a first and a second delay line, wherein the first and second delay lines are a weighted binary delay line and a linear discrete delay line respectively, and wherein delay s available through the first delay line are different than delays available through the second delay line, a method of delaying a signal, the method comprising:

receiving the signal;

forming a first delayed signal by passing the signal through the first de delay line;

forming a second delayed signal by passing the signal through the second delay line;

selecting one of the first and second delayed signals as a function of a desired delay, wherein selecting includes selecting the first delayed signal for a first delay and the second delay signal for a second delay, wherein the second delay is not equal to the first delay; and driving the selected delayed signal.

5. The method according to claim 4, wherein the first and second delay lines introduce a glitch in the first and second delayed signals when delay in the delay lines is increased and wherein selecting one of the first and second delayed signals includes selecting the first delayed signal while the second delay line is in transition to a new delay.

6. The method according to claim 4, wherein the first and second delay lines are binary weighted delay lines and wherein selecting one of the first and second delayed signals includes selecting the first delayed signal while the second delay line is in transition to a new delay.

7. A method of suppressing glitches in the output signal of a binary weighted delay system having first and second binary weighted delay lines, wherein each delay line includes an input and an output and wherein a first control code selects delay in the first binary weighted delay line and a second control code selects delay in the second binary weighted delay line, the method comprising:

forming a first delayed signal by passing the signal through the first binary weighted delay line;

forming a second delayed signal by passing the signal through the second binary weighted delay line;

diving the first delayed signal as the output signal;

determining that a change in delay is needed, wherein determining includes comparing the first and second control codes;

changing delay in the second binary weighted delay line;

waiting a predetermined period of time; and driving the second delayed signal as the output signal.

8. The method according to claim 7, wherein the method further includes changing delay in the first binary weighted delay line after the predetermined period of time.

* * * * *

UNITED STATES PATENT AND TRADEMARK OFFICE
CERTIFICATE OF CORRECTION

PATENT NO. : 6,518,812 B1
DATED : February 11, 2003
INVENTOR(S) : Mark R. Sikkink and Nan Ma It is certified that error appears in the above-identified patent and that said Letters Patent is hereby corrected as shown below:

Column 2,
Line 22, delete "is" after "delayed" and insert -- is -- after "signal".

Column 5,
Line 51, delete "542" and insert -- 54.2 -- therefor.
Line 51, delete "ice" and insert -- instance -- therefor.
Line 53, delete "fist" and insert -- first -- therefor.

Column 7,
Line 19, delete "de" after "first".

Signed and Sealed this

Seventh Day of October, 2003

JAMES E. ROGAN
*Director of the United States Patent and Trademark Office*